United States Patent [19]
Webster

[11] Patent Number: 5,426,389
[45] Date of Patent: Jun. 20, 1995

[54] SYSTEM FOR DC RESTORATION OF SERIALLY TRANSMITTED BINARY SIGNALS

[75] Inventor: Stephen Webster, Oakville, Canada

[73] Assignee: Gennum Corporation, Burlington, Canada

[21] Appl. No.: 6,397

[22] Filed: Jan. 21, 1993

[51] Int. Cl.[6] .............................................. H03K 5/01
[52] U.S. Cl. .................................... 327/170; 327/180; 327/179; 330/11
[58] Field of Search ............... 327/546, 540, 553, 162, 327/164, 14, 54; 330/11

[56] References Cited

U.S. PATENT DOCUMENTS

| | | | |
|---|---|---|---|
| 3,207,998 | 9/1965 | Corney et al. | 330/11 |
| 3,579,123 | 5/1971 | Koga | 328/164 |
| 3,737,793 | 6/1973 | Buch et al. | 330/11 |
| 4,481,433 | 11/1984 | Fisher et al. | 307/546 |

Primary Examiner—Timothy P. Callahan
Assistant Examiner—Dinh Le
Attorney, Agent, or Firm—Bereskin & Parr

[57] ABSTRACT

A device for restoring DC and non-zero average components of a serially transmitted binary signal which has been AC coupled. The device comprises an input port for the binary signal, a clamping circuit, a feedback network, a summing node, and an output port. The input port includes a capacitor for coupling the binary signal to the summing node and the clamping circuit. The feedback network includes an input and an output which are also connected to the summing node. The clamping circuit clamps the positive and negative peaks of the AC coupled binary signal which exceed a predetermined range. The feedback network latches the AC coupled binary signal and produces a current signal. For a binary signal which is within the predetermined range, the clamping circuit exhibits a very high input impedance, thereby causing the current signal to charge the coupling capacitor and produce a voltage which is added to the AC coupled binary signal at the summing node. The output port includes a comparator which converts the restored AC coupled binary signal to digital logic levels. In another embodiment, the clamping circuit includes a current sensor for producing an amplitude signal which is indicative of the amplitude of the AC coupled binary signal. The amplitude signal is fed to an automatic gain controller which produces a gain control voltage for controlling the operation of a high frequency equalizer.

14 Claims, 7 Drawing Sheets

FIG. 9d $I_{SIG}$

FIG. 9e

SYSTEM FOR DC RESTORATION OF SERIALLY TRANSMITTED BINARY SIGNALS

FIELD OF THE INVENTION

This invention relates to direct current (DC) restoration of serially transmitted binary signals. More particularly, the invention relates to a hysteretic bipolar clamp DC restorer circuit particularly suited for use with automatic co-axial cable equalizers.

BACKGROUND OF THE INVENTION

In signal transmission applications where the average or DC component of a serially transmitted binary signal is non-zero, the DC component of the signal must be restored at the receiver in order to achieve accurate data reproduction. Where the transmission medium is a coaxial cable which includes AC coupling methods for signal transmission, there are two steps required to recover the transmitted data. The first step involves high frequency equalization to compensate for losses during transmission in the cable. The second step involves DC restoration of the equalized signal to recover the low frequency and DC components which are lost through the coupling circuits.

Quantized Feedback (QFB) is the standard technique for DC restoration of an AC coupled binary signal. The Quantized Feedback method has been utilized in practical implementations for cable equalizers for serial digital transmission applications. However, the Quantized Feedback method is sensitive to variations in the amplitude and rise time of the input waveform. As will be appreciated by one skilled in the art, this sensitivity places considerable emphasis on the performance of the high frequency equalizer because as the length of the transmission cable increases, the signal losses become more severe and precise equalization will eventually be impossible. As a result of this sensitivity, the Quantized Feedback method can introduce jitter into the restored waveform.

SUMMARY OF THE INVENTION

The present invention provides a new approach to DC restoration which, unlike the Quantized Feedback technique, can operate correctly over a wide variation of input signal quality, and therefore is inherently better suited for the role of DC restorer in cable equalizers.

In a first aspect, the present invention provides a device for restoring a binary signal having a DC value and having one or more pulses each with a rising edge and a falling edge, the binary signal being coupled to said device by a capacitor having first and second terminals, said device comprising: (a) an input port coupled to the first terminal of the capacitor for receiving the binary signal and producing a coupled binary signal; (b) clamping means for clamping the coupled binary signal when said coupled binary signal exceeds a predetermined range, said clamping means having an input for receiving said coupled binary signal and being connected to the second terminal of the capacitor; (c) means for generating a signal component for controlling the rising and falling edges of the pulses in the coupled binary signal, said means for generating having an output for said signal component and said output being coupled to the second terminal of the capacitor; (d) means for combining said signal component with the coupled binary signal to produce a restored binary signal and said restored binary signal having pulses with rising and falling edges dependent on said signal component, said means for combining being connected to the output of said means for generating and to the second terminal of the capacitor; and (e) means for outputting the restored binary signal, said means for outputting having an input connected to said means for combining and an output connected to the input of said means for generating.

In a second aspect, the present invention provides a device for restoring a binary signal having a DC value and having one or more pulses each with a rising edge and a falling edge, said device being suitable for use with a high frequency equalizer circuit in a cable equalizer system, said device comprising: (a) an input port for receiving the binary signal, said input port being formed from a first terminal of a capacitor for producing a coupled binary signal; (b) clamping means for clamping the coupled binary signal when said coupled binary signal exceeds a predetermined range, said clamping means having an input for receiving said coupled binary signal and said input being connected to a second terminal of said capacitor; (c) means for generating a signal component for controlling the rising and falling edges of the pulses in the coupled binary signal, said generating means having an output for said signal component and said output being coupled to the second terminal of said capacitor; (d) means for combining said signal component to the coupled binary signal to produce a restored binary signal and said restored binary signal having pulses with rising and falling edges dependent on said signal component, said means for combining being connected to the second terminal of said capacitor and to the output of said generating means; (e) output means for outputting said restored binary signal, said output means having an input connected to said means for combining and an output connected to the input of said means for generating; and (f) gain control means for producing a gain control signal, said gain control means having an input coupled to said damping means, and said clamping means including means for producing an amplitude signal responsive to the amplitude of said coupled binary signal, and said gain control means including means for generating said gain control signal from said amplitude signal received at said input.

In a third aspect, the present invention provides a method for restoring a binary signal having a DC value and having one or more pulses each with a rising edge and a falling edge, the binary signal being coupled through a capacitor, said method comprising the steps of: (a) inputting the binary signal through the capacitor to produce a coupled binary signal; (b) clamping said coupled binary signal when said coupled binary signal exceeds a predetermined range; (c) generating a signal component responsive to said coupled binary signal for controlling the rising and falling edges of the pulses in said coupled binary signal; and (d) combining said signal component with said coupled binary signal to produce a restored binary signal.

BRIEF DESCRIPTION OF THE DRAWINGS

For a better understanding of the present invention, and to show more clearly how it may be carried into effect, reference will now be made, by way of example, to the accompanying drawings which show a preferred embodiment of the present invention.

DETAILED DESCRIPTION OF THE PREFERRED EMBODIMENTS

The transmission of serial encoded binary data requires a transmission medium with a wide bandwidth, since the frequency content of such signals is broad. Co-axial cables are utilized as the transmission medium in typical data transmission systems.

Figure 1:
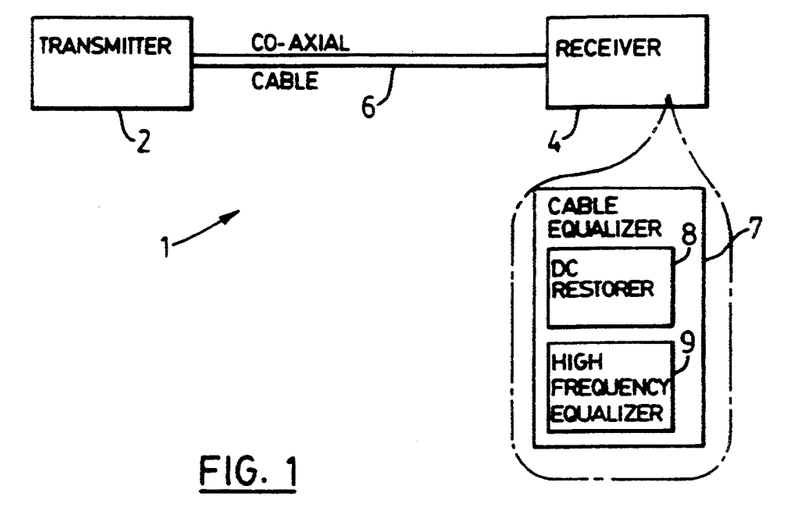
FIG. 1 shows a typical co-axial transmission system in simplified block diagram form.

FIG. 1 shows a typical known transmission system 1 in simplified block diagram form. The system 1 comprises a transmitter 2 and a receiver 4. The transmitter 2 and receiver 4 are coupled together by a co-axial cable 6 which serves as the transmission medium. In known manner, the transmitter 2 includes electronic circuitry (not shown) for encoding the information to be transmitted into serial binary data. Similarly, the receiver 4 includes circuitry (not shown) for decoding (e.g. demodulating) the transmitted serial binary data. In a system 1 where the co-axial cable 6 is AC coupled, the receiver 4 will include a cable equalizer circuit 7 which comprises a restoration circuit 8 and a high frequency equalizer 9. The function of the restoration circuit 8 is to recover the low frequency and DC components of the serial binary signal. The low frequency and DC components of the serial signal are lost through the AC coupling circuits (not shown) as will be understood by one skilled in the art. Before describing the restoration circuit 8 according to the present invention, a typical known restoration method and system will be discussed.

The Quantized Feedback method is a known standard technique for DC restoration of an AC coupled binary signal. In the following description, DC and AC refer to direct current and alternating current respectively. As will be shown below, the Quantized Feedback (QFB) method is sensitive to variations in the amplitude and rise time of the input binary signal waveform. This sensitivity places considerable demands on the high frequency equalizer 9, which as is known compensates for losses in the cable by restoring the amplitude of the binary signal. It will be appreciated by one skilled in the art that as the length of the co-axial cable increases, the signal losses become more severe and precise performance by the high frequency equalizer 9 is no longer possible. Thus, there will be a performance loss for the QFB method when utilized in cable equalizer 7 applications. Before explaining the details of the present invention, the Quantized Feedback method and its sensitivity to the shape of the input waveform will be considered in greater detail.

Figure 2A:
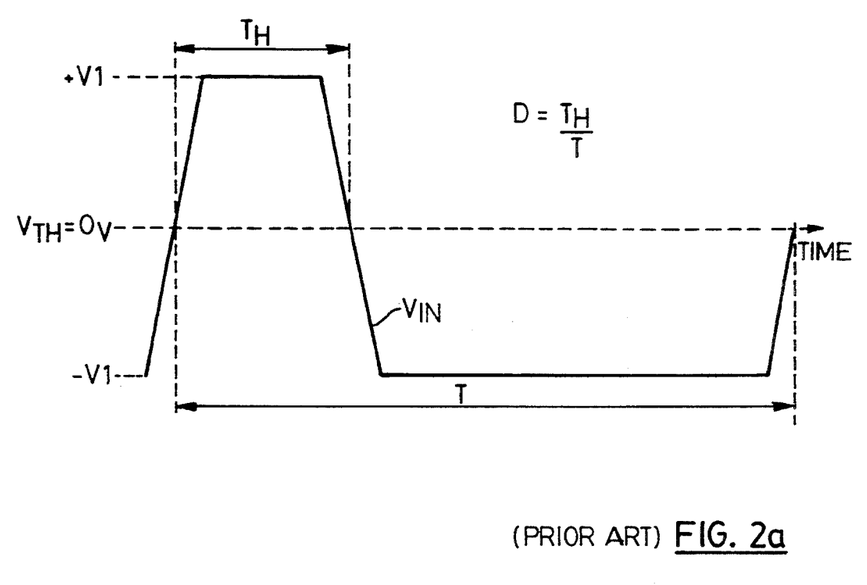
FIG. 2(a) shows a typical binary signal (input waveform) prior to AC coupling.
Figure 2B:
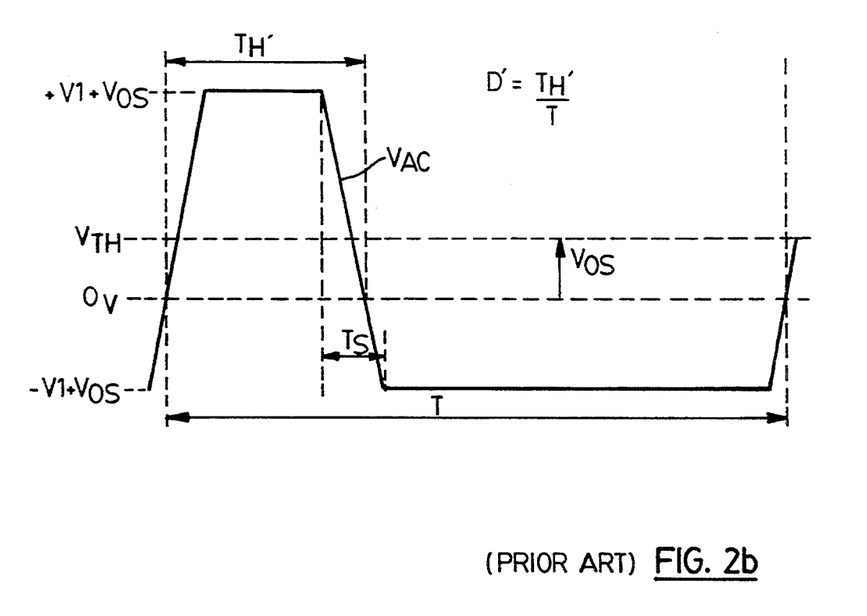
FIG. 2(b) shows the binary signal (of FIG. 2(a)) after AC coupling.

The serial binary signal (not shown in FIG. 1) which is transmitted by the co-axial cable 6 is received by the receiver 4 as an input binary signal. FIG. 2(a) depicts an input binary signal $V_{IN}$ to AC coupling and FIG. 2(b) shows an AC coupled binary signal waveform $V_{AC}$ which represents the input binary signal $V_{IN}$ subsequent to AC coupling. It will be appreciated by those skilled in the art that AC coupling techniques involve using a coupling capacitor (not shown) and such techniques are common features of co-axial transmission systems.

Referring to FIG. 2(a), the input binary signal $V_{IN}$ is shown as having a logic '1' defined by the voltage level $+V_1$, and a logic '0' defined by a voltage level $-V_1$, and a threshold voltage $V_{TH}$. The threshold voltage $V_{TH}$ is the voltage level which defines the transition between the logic 1 level and the logic 0 level or vice versa. As shown in FIG. 2(a), the threshold voltage $V_{TH}$ for the input binary signal $V_{IN}$ is taken as the midpoint between the logic 1 and logic 0 levels, which in this case is zero volts. The input binary signal $V_{IN}$ also has a period T and a duty cycle D. The duty cycle is defined as the duration of the logic '1' pulse, denoted by $T_H$, divided by the period of the binary signal $V_{IN}$ denoted by T.

A consequence of AC coupling is the loss of the low frequency and the DC components in the input binary signal $V_{IN}$. The loss of the DC component can lead to two other effects. First, the loss of the DC component due to AC coupling can change the duty cycle D which results in jitter. Secondly, the AC coupling can also lower the noise margin of the input binary signal $V_{IN}$. The effects of AC coupling on the duty cycle and noise margin will be considered with reference to the AC coupled binary signal shown in FIG. 2(b).

In FIG. 2(b), AC coupling of the input binary signal $V_{IN}$ introduces a DC offset voltage $V_{OS}$. The DC offset voltage $V_{OS}$ is the difference between the threshold voltage $V_{TH}$ of the input binary signal $V_{IN}$ and the mid-way point of the AC coupled binary signal $V_{AC}$. Furthermore, as a result of the DC offset voltage, the logic '1' level for the AC coupled binary signal is defined by a voltage level which is the sum of $-V_1$ and $V_{OS}$. Similarly, the logic '0' level for the AC coupled binary signal is defined by a voltage level which is the sum of $-V_1$ and $V_{OS}$. As shown in FIG. 2(b), the DC offset voltage $V_{OS}$ also changes the duty cycle of the AC coupled binary signal by altering the duration $T_H$ of the logic '1' pulse.

The effect of AC coupling and the resultant DC offset voltage $V_{OS}$ will be illustrated by considering the steady state condition. In the steady state condition, the net current flowing into the coupling capacitor (not shown) must be zero. This condition can also be expressed by saying that the integral of the AC coupled binary signal $V_{AC}$ (FIG. 2(b)) over one cycle is zero. Using this property of the steady state condition, an expression (1) for determining the off-set voltage $V_{OS}$ as a function of the duty cycle D can be derived. The off-set voltage $V_{OS}$ is the difference between the original threshold voltage $V_{TH}$ (i.e. zero volts in this case) and the threshold voltage of the AC coupled binary signal $V_{AC}$ of FIG. 2(b). (Taken as the mid-point between the logic '1' and logic '0' levels.)

$$V_{OS} = V_1 * (1 - 2*D) \quad (1)$$

In the above expression, the AC coupled binary signal $V_{AC}$ is expressed as a function of the duty-cycle D. As is known, it is desirable to eliminate the off-set voltage $V_{OS}$ because it can lower the noise margin. Furthermore, in practical systems where there are finite rise and fall times, the off-set voltage $V_{OS}$ changes the duty-cycle of the input binary signal $V_{IN}$ which results in jitter.

The jitter problem can be illustrated by considering the duty-cycle D of the original input binary signal $V_{IN}$ and the AC coupled binary signal $V_{AC}$ shown in FIGS. 2(a) and 2(b) respectively. Assuming that the input binary signal $V_{IN}$ has equal rise and fall times, denoted by $T_S$, then the following expression (2) for the duty-cycle D' of the AC coupled binary signal $V_{AC}$ can be derived.

$$D' = D + (V_{OS}/V_1) * (T_S/T) \quad (2)$$

Substituting expression (1) for the off-set voltage $V_{OS}$ derived above, the duty-cycle D' for the AC coupled binary signal $V_{AC}$ can be rewritten as:

$$D' = D + (1 - 2*D) * (T_S/T) \quad (3)$$

It can be seen from the above expressions (2) and (3) that there will be zero jitter (i.e. duty-cycle D = duty-cycle D'), if either the rise-time $T_S$ is zero, or the duty-cycle D of the input binary signal $V_{IN}$ is 0.5. It will therefore be appreciated that a small rise-time $T_S$ in the input binary signal $V_{IN}$ can help reduce the jitter caused by AC coupling. However, a small rise-time $T_S$ has no effect on the diminished noise margin which is another by-product of the off-set voltage $V_{OS}$.

The Quantized Feedback Method (Prior Art)

Figure 3:
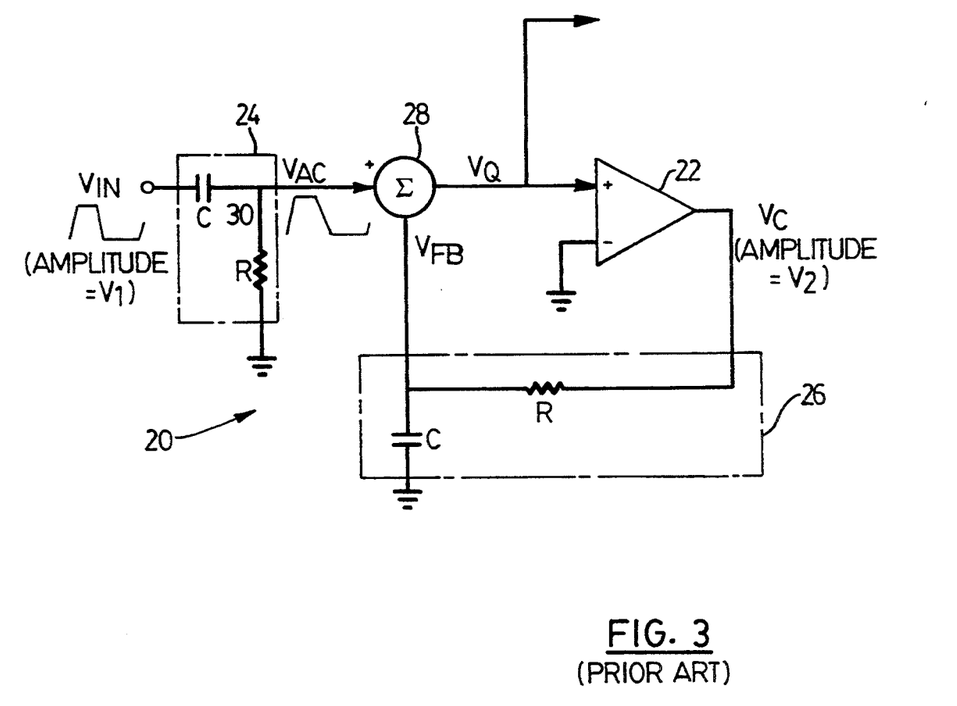
FIG. 3 shows a known system utilizing the Quantized Feedback method (prior art)

The Quantized Feedback (QFB) method is one known technique which is used for DC restoration of serially transmitted binary signals. The QFB achieves DC restoration by reducing the offset voltage $V_{OS}$ to as small a voltage as practically possible. FIG. 3 shows a typical known Quantized Feedback (QFB) system indicated by reference 20. The QFB system 20 restores the DC component in the AC coupled binary signal $V_{AC}$ to produce a DC restored output signal $V_Q$. The following discussion will demonstrate that while the QFB system of FIG. 3 reduces the offset voltage $V_{OS}$, it can contribute to jitter in the restored output signal $V_Q$, and the jitter is proportional to both the error between the amplitude of the input binary signal $V_1$ and the amplitude of the comparator output signal $V_2$, and the rise time $T_S$ of the input signal.

The Quantized Feedback system 20 shown in FIG. 3 comprises a voltage comparator 22, an input RC network 24, a feedback loop RC network 26, and a summation unit 28. The input RC network 24, provides one of the inputs to the summation unit 28 and couples the binary signal $V_{IN}$ to the QFB system 20 through a coupling capacitor 30. The other input for the summation unit 28 is derived from the feedback loop RC network 26, which in turn is coupled to the output of the voltage comparator 22. In known manner, the voltage comparator 22 produces an output voltage signal $V_C$. The feedback loop RC network 26 then filters the output voltage $V_C$ to produce a feedback voltage signal $V_{FB}$ which provides the other input to the summation unit 28. The summation unit 28 adds the voltage feedback signal $V_{FB}$ to the AC coupled signal $V_{AC}$ that is derived from the input binary signal $V_{IN}$ (i.e. the input binary signal $V_{IN}$ has been integrated using the input RC network 24). The output of the summation unit 28 is the restored voltage signal $V_Q$ which is the sum of the AC coupled voltage signal $V_{AC}$ and the feedback voltage signal $V_{FB}$. Therefore, the function of the prior art QFB system shown in FIG. 3 is to reduce the off-set voltage $V_{OS}$ by adding the voltage feedback signal $V_{FB}$ to the AC coupled binary signal $V_{AC}$.

The following discussion will demonstrate that the known Quantized Feedback system 20 shown in FIG. 3 jitter. The jitter is proportional to both the error between the amplitude of the input binary signal $V_{IN}$ and the comparator output signal $V_C$, and the rise time $T_S$ of the input binary signal $V_{IN}$.

In the Quantized Feedback system 20 shown in FIG. 3, the input RC network 24 has the same time constant as the feedback loop RC network 26 (which provides a low pass filter function). To simplify the following analysis, the time constant for the input RC network 24 and the feedback loop RC network 26 are assumed to be large so that the feedback voltage signal $V_{FB}$ can be considered to be a DC quantity. In known manner, the feedback voltage signal $V_{FB}$ can be expressed in terms of the output voltage $V_C$ of the comparator 22 and the duty-cycle $D_Q$ of the DC restored output signal $V_Q$ from the summation unit 28 as follows:

$$V_{FB} = V_C * (2*D_Q - 1) \quad (4)$$

where $D_Q$ is the duty-cycle of the DC restored output signal $V_Q$.

As shown previously, the steady state AC coupled binary signal $V_{AC}$ can be expressed as the sum of the original binary signal $V_{IN}$ and the offset voltage $V_{OS}$, and using this property the following expression for the DC restored output signal $V_Q$ can be written:

$$V_Q = V_{IN} + V_{OS} + V_{FB} \quad (5)$$

(i.e., $V_{AC} = V_{IN} + V_{OS}$)

and the duty-cycle $D_Q$ of the DC restored output signal $V_Q$ can also be expressed as follows: (where $V_1$ is the amplitude of $V_{IN}$; $V_2$ is the amplitude of $V_C$)

$$D_Q = D + ((V_{OS} + V_{FB})/V_1) * (T_S/T) \quad (6)$$

Substituting expression (1) for the offset voltage $V_{OS}$ and expression (4) for the feedback voltage $V_{FB}$ into expression (6) above, expression (7) can be derived for the duty-cycle $D_Q$ of the DC restored output signal $V_Q$:

$$D_Q = \frac{D * (1 - 2*T_S/T) + (1 - V_2/V_1) * T_S/T}{(1 - (V_2/V_1) * (2*T_S/T))} \quad (7)$$

From the two above expressions for duty-cycle $D_Q$, i.e. (6) and (7), it can be seen that the condition for zero jitter, i.e. $D_Q = D$, is either the requirement that the amplitude $V_1$ of the input binary signal $V_{IN}$ is equal to the amplitude $V_2$ of the comparator output signal $V_C$, or that the rise time $T_S$ of the input binary signal $V_{IN}$ is zero. It follows that minimum jitter and maximum noise margin in the DC restored output signal $V_Q$ will result when the offset voltage $V_{OS}$ is cancelled exactly by the feedback voltage $VF_B$. This corresponds to the condition of the amplitude $V_1$ of the input binary signal $V_{IN}$ being equal to the amplitude $V_2$ of the DC restored voltage signal $V_Q$. Conversely, if equal amplitudes (i.e. $V_1=V_2$) cannot be maintained, the above expression shows that the Quantized Feedback system 20 (shown in FIG. 3) will introduce jitter into the DC restored output signal $V_Q$ and the jitter will be proportional to both the error between the amplitudes of the input binary signal $V_{IN}$ (i.e. $V_1$) and the comparator output signal $V_C$ (i.e. $V_2$) and the rise time of the input binary signal $V_{IN}$ (i.e. $T_S$).

A HYSTERETIC BIPOLAR CLAMP DC RESTORER (THE PRESENT INVENTION)

Figure 4:
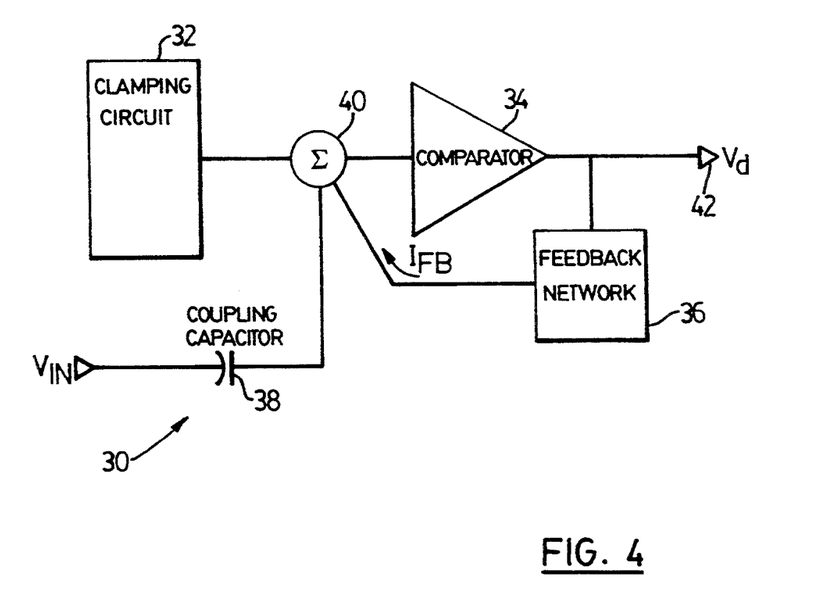
FIG. 4 shows in block diagram form a hysteretic bipolar clamp DC restorer according to the present invention.

Reference is now made to FIG. 4 which shows in block form the elements of a hysteretic bipolar clamp DC restorer 30 according to the present invention. The clamp DC restorer 30 comprises a clamping circuit 32, a voltage comparator 34, and a feedback network 36. The input binary signal $V_{IN}$ is coupled to the DC restorer 30 through a coupling capacitor 38. One terminal of the coupling capacitor 38 is connected to a summing node 40. The summing node 40 is formed from the input terminal of the clamping circuit 32, the positive input terminal of the voltage comparator 3 and the output terminal of the feedback network 36.

Figure 5:
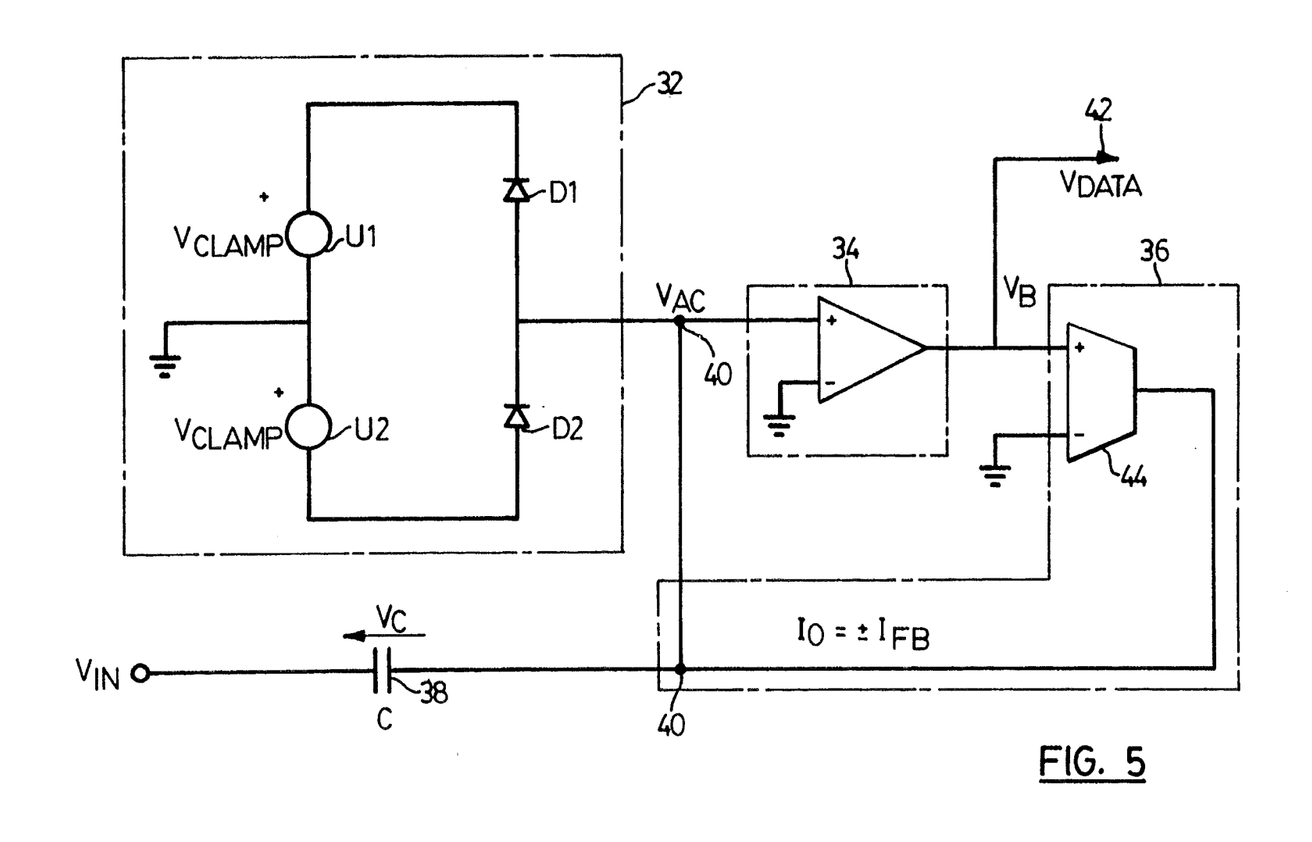
FIG. 5 shows in schematic form the hysteretic bipolar clamp DC restorer of FIG. 4.

Reference is next made to FIG. 5 which shows in data the circuit elements that comprise the DC restorer 30. The voltage comparator 34 provides a digital data output 42 for a DC restored output signal $V_{DATA}$. The output 42 of the voltage comparator 34 also feeds into the positive terminal of a differential buffer 44. The differential buffer 44 produces a feedback output current $I_{FB}$ which flows into the summing node 40.

Referring still to FIG. 5, the clamping circuit 32 comprises first and second diodes $D_1$ and $D_2$. The anode of the first diode $D_1$ is connected to the cathode of the second diode $D_2$ and to the summing node 40. The cathode of diode $D_1$ is connected to the positive terminal of a first clamping voltage reference $U_1$. The negative terminal of the clamping voltage reference $U_1$ is connected to signal ground and to the positive terminal of a second clamping voltage reference $U_2$. The negative terminal of the second voltage reference $U_2$ is connected to the anode of the second diode $D_2$ to complete the clamping circuit 32.

The function of the first voltage reference $U_1$ is to set the clamping voltage for the first diode $D_1$, that is, the voltage level at which diode $D_1$ will turn-on in response to a signal being present at node 40. In other words, diode $D_1$ clamps the positive peak of the AC coupled binary signal $V_{AC}$ when the peak voltage value exceeds the value of the first voltage reference $U_1$. In a similar fashion, the second voltage reference $U_2$ sets the voltage value for clamping the negative peak of the AC coupled binary signal $V_{AC}$ at the node 40. Accordingly, the clamp circuit 32 clamps both the positive and negative peaks of the AC coupled binary signal $V_{AC}$.

As shown in FIG. 5, the voltage comparator 34, the feedback network 36 and the summing node 40 form a positive feedback loop. The function of this feedback network 36 is two-fold First, the feedback network 36 uses the voltage comparator 34 to "latch" the logic state of the AC coupled binary signal $V_{AC}$ following the last transition of the signal $V_{AC}$. The output of the comparator 34 remains latched in this state until there is another transition in the AC coupled binary signal $V_{AC}$. The output of the comparator 34 is tapped to provide the output terminal 42 for the DC restored output signal $V_{DATA}$. It will be appreciated that the voltage comparator 34 converts the AC coupled binary signal $V_{AC}$ (analog format) into a digital format data output signal, i.e. the positive peak of the DC restored output signal $V_{DATA}$ corresponds to a logic HIGH and the negative peak corresponds to a logic LOW value as determined by the supply settings of the comparator 34.

The second function of the feedback network 36 is to produce the feedback current $I_{FB}$ for restoring the AC coupled binary signal $V_{AC}$ at the summing node 40. The feedback current $I_{FB}$ is generated by the buffer 44 which takes the output from the voltage comparator 34 as its positive input. The output of the buffer 44 is connected to the summing node 40 thereby completing the positive feedback loop for the feedback current $I_{FB}$. At the summing nodes 40, the feedback current $I_{FB}$ is added to the AC coupled binary signal $V_{AC}$.

Figure 6A:
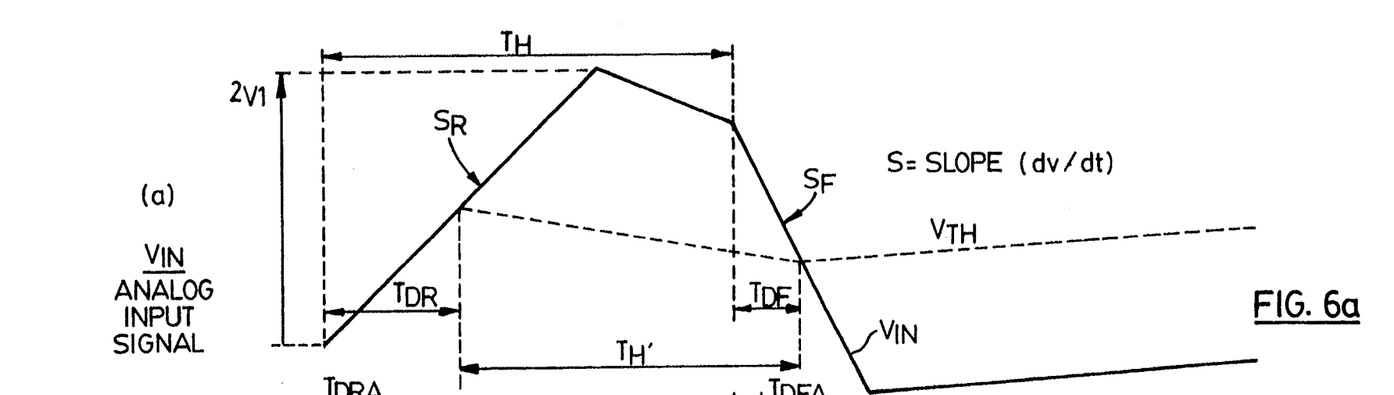
FIG. 6(a) shows a binary signal which has been subject to coaxial cable transmission and AC coupling.

As was discussed above, the DC restorer circuit 30 according to the present invention reduces "jitter" in the AC coupled binary signal $V_{AC}$. The implementation of this function will be explained by referring to both FIGS. 5 and 6. FIG. 6($a$) shows the input binary signal $V_{IN}$ which is coupled to the DC restorer circuit 30 by the coupling capacitor 38. The input binary signal $V_{IN}$ as shown in FIG. 6($a$) exhibits jitter as a result of unequal rise and fall times, which are denoted by the rising and falling slopes $S_R$ and $S_F$ respectively. The amplitude of the input binary signal $V_{IN}$ is $2V_1$ (i.e. $+V_1$ to $-V_1$) peak-to-peak.

One way to achieve zero jitter in the input binary signal $V_{IN}$ is by making the rise time equal to the fall time, i.e. slope $S_R$=slope $S_F$. This property can be illustrated by considering the characteristics of the input binary signal $V_{IN}$ shown in FIG. 6($a$). In FIG. 6($a$), the bit-width of the input binary signal $V_{IN}$ (as transmitted) is denoted by $T_H$. The bit-width $T_H$ is the interval between the starting points of the low to high and high to low transitions. The effective or actual bit-width $T_H'$ which is the interval between the points where the transitions (i.e. rising slope $S_R$ and falling slope $S_F$) cross the threshold voltage $V_{TH}$ (i.e. mid-level voltage value). Referring to FIG. 6($a$) the effective bit-width $T_H'$ of the input binary signal $V_{IN}$ can be expressed in terms of the bit-width $T_H$ and respective delays (denoted by $T_{DR}$ and $T_{DF}$ in FIG. 6($a$)) between the start of the rising and the falling edges $S_R$, $S_F$ and the points where the input binary signal $V_{IN}$ crosses the logic threshold $V_{TH}$. Using simple addition, the effective bit-width $T_H'$ is:

$$T_H' = T_H + T_{DF} - T_{DR} \qquad (8)$$

The rise and fall delay times (i.e. $T_{DR}$ and $T_{DF}$) can be expressed in terms of the rising and falling slopes $S_R$ and $S_F$ and the amplitude $V_1$ of the input binary signal $V_{IN}$, as follows:

$$T_{DF} = -V_1/S_F \qquad (9)$$

$$T_{DR} = V_1/S_R \qquad (10)$$

Substituting the above expressions (9) and (10) for the rise and fall time delays $T_{DR}$ and $T_{DF}$ into expression (8) yields the following result for the effective bit-width $T_{H'}$:

$$T_{H'} = T_H - V_1/S_F - V_1/S_R \qquad (11)$$
$$= T_H - V_1 * (1/S_F + 1/S_R)$$

Therefore according to expressions (8) and (11), there will be zero jitter (i.e. $T_{H'} = T_H$) if the rise delay time $T_{DR}$ equals the fall delay time $T_{DF}$ in expression (8), and this requires that the rising slope equal the falling slope, i.e. $S_R = S_F$.

Figures 6B, 6C:
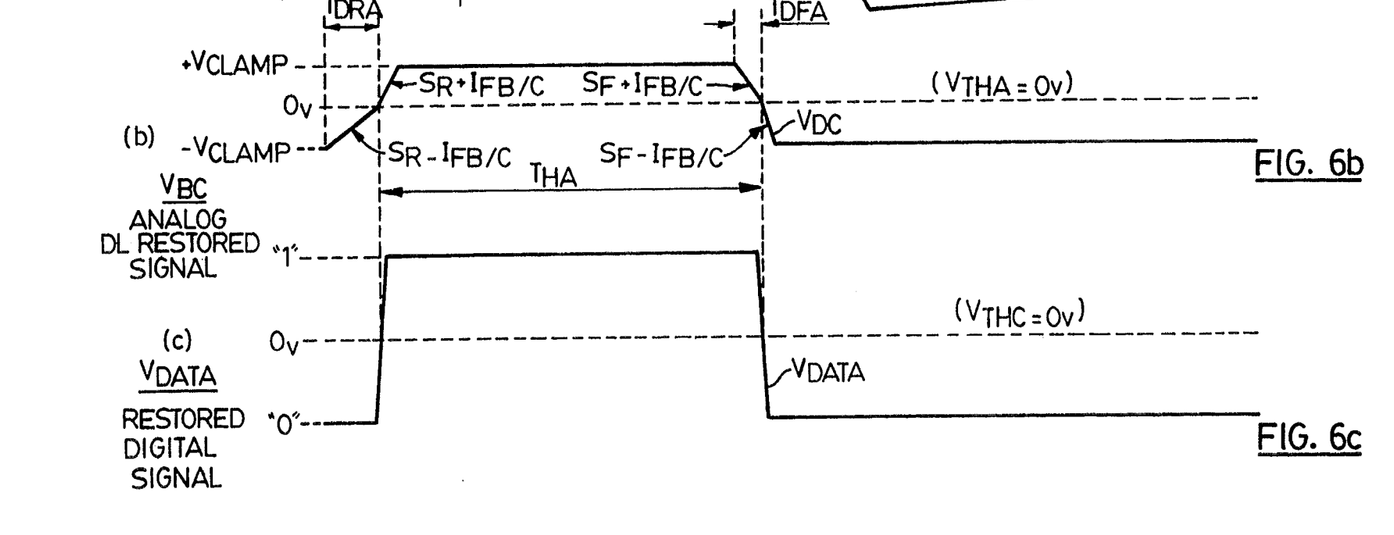
FIG. 6(b) shows the intermediate restoration of the binary signal (of FIG. 6(a)) according to the present invention.
FIG. 6(c) shows the complete restoration of the binary signal (of FIG. 6(a)) according to the present invention.

Reference is next made to FIG. 6(b) which shows the AC coupled binary signal $V_{AC}$ restored according to the present invention to produce a DC restored binary (i.e. analog) signal denoted by the reference $V_{DC}$. The DC restored binary signal $V_{DC}$ is produced at the summation node 40 by the operation of the clamping circuit 32 and the feedback current $I_{FB}$. The DC restored binary signal $V_{DC}$ is produced by clamping the AC coupled binary signal $V_{AC}$ and using the feedback current $I_{FB}$ to control the rise and fall times.

Referring to FIG. 6(b), the positive peak of the DC restored binary signal $V_{DC}$ is given by the voltage $+V_{CLAMP}$. The voltage value $+V_{CLAMP}$ corresponds to the peak value of the AC coupled binary signal $V_{AC}$ which is clamped by diode $D_1$ and voltage reference $U_1$. Similarly, the negative value of the DC restored binary signal $V_{DC}$ is given by the voltage $-V_{CLAMP}$, which corresponds to the negative peak of the AC coupled binary signal $V_{AC}$ which is clamped by diode $D_2$ and voltage reference $U_2$. When the AC coupled binary signal $V_{AC}$ is clamped, the feedback current $I_{FB}$ flows into the respective diode, i.e. either $D_1$ or $D_2$. For the purposes of the following analysis, the diodes $D_1$ and $D_2$ are considered to be ideal, i.e. the forward voltage-drop is negligible. Another property of the clamping circuit 32 for this analysis is the very high input impedance for voltages within the range $+V_{CLAMP}$ to $-V_{CLAMP}$. This high input impedance forces virtually all of the feedback current $I_{FB}$ to flow into the coupling capacitor 38 when the AC coupled binary signal $V_{AC}$ is within the clamping voltage range, i.e. the diode $D_1$ or $D_2$ is not conducting.

The operation of the clamping circuit 32 can be demonstrated by considering the rising edge $S_R$ of the DC restored binary signal $V_{DC}$. The polarity of the feedback current $I_{FB}$ is negative as long as the input binary signal $V_{IN}$ is less then zero volts. The polarity of the feedback current $I_{FB}$ is controlled by the voltage comparator 34 and buffer 44 (FIG. 5). At the start of the transition period indicated by reference 46 in FIG. 6(b), diode $D_2$ is turned off which causes the feedback current $I_{FB}$ to flow into the coupling capacitor 38. Since by design the feedback current $I_{FB}$ has a constant value, the effect on the voltage $V_C$ of the capacitor 38 is a linear charging with a rate of $I_{FB}/C$, where C is the capacitance of capacitor 38. However, this change in the voltage $V_C$ of the coupling capacitor 38 will be opposed by the change in the input binary signal $V_{IN}$ as long as the AC coupled binary signal $V_{AC}$ is negative (i.e. the AC coupled binary voltage $V_{AC}$ controls the polarity of the feedback current $I_{FB}$). It follows that the DC restored binary signal $V_{DC}$ will have a slope that is the difference between the transition rate of the input binary signal $V_{IN}$ and the rate of change of the voltage $V_C$ of the coupling capacitor 38. This is shown in FIG. 6(b), where the DC restored binary signal $V_{DC}$ has rising and falling slopes denoted by $S_{RA}$ and $S_{FA}$ respectively The rising slope for the DC restored signal $V_{DC}$ can be expressed as:

$$S_{RA} = S_R - I_{FB}/C \qquad (12)$$

where $S_R$ is the rising slope of the input binary signal $V_{IN}$ and the second term is the charging capacitor voltage $V_C$ resulting from the feedback current $I_{FB}$. Similarly, the falling slope for the DC restore binary signal $V_{DC}$ can be expressed as follows:

$$S_{FA} = -(S_F + I_{FB}/C) \qquad (13)$$

where $S_F$ is the falling slope of the input binary signal $V_{IN}$ (FIG. 6(a)) and the second term is charging rate of the coupling capacitor 38 by the feedback current $I_{FB}$.

The rising and falling slopes, $S_{RA}$ and $S_{FA}$, for the DC restored binary signal $V_{DC}$ can be converted to corresponding rising and falling edge delays, $T_{DRA}$ and $T_{DFA}$, by using the clamped voltage values $+V_{CLAMP}$ and $-V_{CLAMP}$ of the references $U_1$ and $U_2$ for the peak amplitudes of the DC restored binary signal $V_{DC}$, as follows:

$$T_{DRA} = V_{CLAMP}/S_{RA} = V_{CLAMP}/(S_R - I_{FB}/C) \qquad (14)$$

$$T_{DBA} = -V_{CLAMP}/-S_{FA} = V_{CLAMP}/(S_F + I_{FB}/C) \qquad (15)$$

Referring still to FIG. 6(b), the DC restored binary signal $V_{DC}$ has a bit-width $T_{HA}$ which can be expressed in terms of the bit-width $T_H$ of the input binary signal $V_{IN}$ and the rise and fall time delays $T_{DRA}$ and $T_{DFA}$ as follows:

$$T_{HA} = T_H + T_{DFA} - T_{DRA} \qquad (16)$$

Substituting the above expressions (14) and (15) for $T_{DRA}$ and $T_{DFA}$ into expression (16) yields the bit-width of the DC restored binary signal $V_{DC}$ in terms of the voltage value $V_{CLAMP}$ of the reference $U_1$ and $U_2$, the feedback current $I_{FB}$ and the rising and falling slopes i.e. $S_R$ and $S_F$.

$$T_{HA} = T_H - V_{CLAMP} * (1/(S_R I_{FB}/C) + 1/(S_F + I_{FB}/C)) \qquad (17)$$

$$S_r * C(\text{or } -S_F * C) >> I_{FB} \qquad (18)$$

It then follows from expression (17) above that the rising and falling slopes, $S_{RA}$ and $S_{FA}$, of the DC restored binary signal $V_{DC}$ are only slightly less steep then those of the input binary signal $V_{IN}$, i.e. $S_R \sim S_{RA}$ and $S_F \sim S_{FA}$ because the feedback current $I_{FB}$ is small. By comparing the expressions (11) and (17) for $T_{H'}$ and $T_{HA}$ respectively, it can be seen that any jitter error in the input binary signal $V_{IN}$ is reduced in the DC restored binary signal $V_{DC}$ by the amount approaching the ratio $V_1/V_{CLAMP}$. This follows from the clamping of the AC coupled binary signal $V_{AC}$ to $+V_{CLAMP}$ and $-V_{CLAMP}$ as discussed above for FIG. 6(b). In the preferred embodiment of the invention, this ratio is typically four or more which produces a reduction in jitter of at least two or three times. It will be appreciated by one skilled in the art that noise margin considerations will limit the jitter reduction achievable by reducing the clamping voltages values $+V_{CLAMP}$ and $-V_{CLAMP}$ for the references $U_1$ and $U_2$.

Referring next to FIG. 6(c), the "latching" function of the voltage comparator 34 will be considered. The "latching" function of the comparator 34 converts the DC restored binary signal $V_{DC}$ to a DC restored digital output signal indicated by reference $V_{DATA}$. The DC restored digital output signal $V_{DATA}$ has logic level "1" and logic level "0" which are set by the voltage comparator 34 output characteristics (i.e. positive and negative voltage rails for comparator 34). The threshold voltage level for converting the DC restored analog signal $V_{DC}$ to the restored digital signal $V_{DATA}$ is determined by the reference voltage level connected to the negative terminal of the voltage comparator 34, which in this case is set to zero volts. Therefore, the output of the voltage comparator 34 will remain high (i.e. logic "1") until the DC restored binary signal $V_{DC}$ makes a transition which is less than the reference voltage level on the negative terminal of the comparator 34. The input characteristics (e.g. high open loop gain) of the voltage comparator 34 can also be used to detect weak AC coupled binary signals $V_{AC}$, for example signals which have been attenuated as a result of being transmitted over long distances over coaxial transmission lines.

AUTOMATIC GAIN ADJUSTMENT FOR HIGH FREQUENCY EQUALIZATION

As discussed for the known system shown in FIG. 1, the binary signal $V_{IN}$ which is received from the coaxial cable 6 will have experienced attenuation or amplitude losses. For accurate data reproduction, the AC coupled binary signal $V_{AC}$ must undergo both high frequency equalization and low frequency equalization (i.e. DC restoration). To compensate for these losses, the cable equalizer 7 includes the DC restorer 8 and the high frequency equalizer 9 (as shown in FIG. 1). As discussed in detail above, the DC restorer 8, according to the present invention, restores the DC and low frequency components of the AC coupled binary signal $V_{AC}$. The high frequency equalizer 9, on the other hand, restores or equalizes the high frequency component of the AC coupled binary signal $V_{AC}$. In a second embodiment of the present invention, the DC restorer 8 described above has been modified and integrated with an automatic gain controller for controlling the operation of the high frequency equalizer. As will be discussed below, the automatic gain controller allows optimum operation of both the modified DC restorer and the high frequency equalizer 9.

Figure 7:
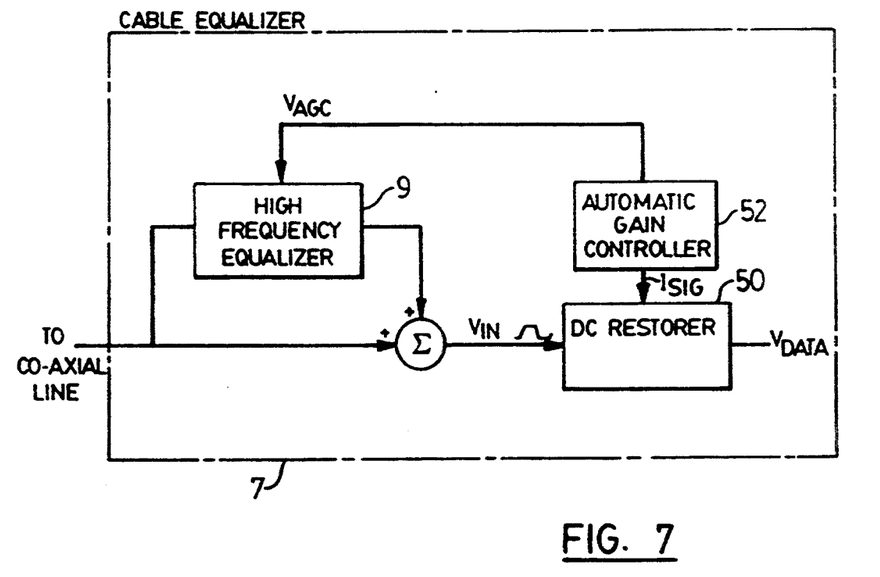
FIG. 7 shows in block form an improved cable equalizer utilizing a second embodiment of a hysteretic bipolar clamp DC restorer according to the present invention.

Reference is next made to FIG. 7 which shows in block form the cable equalizer 7 incorporating a modified DC restorer 50 and an automatic gain controller 52 according to the second embodiment of the present invention. The automatic gain controller 52 is coupled between the modified DC restorer 50 and the high frequency equalizer 9. As will be discussed in detail below, the automatic gain controller 52 produces a voltage control signal $V_{AGC}$ which is a function of the difference between a reference current $I_{REF}$ (FIG. 8) and a signal current $I_{SIG}$. The signal current $I_{SIG}$ is proportional to the amplitude of the AC coupled binary signal $V_{AC}$.

Figure 8:
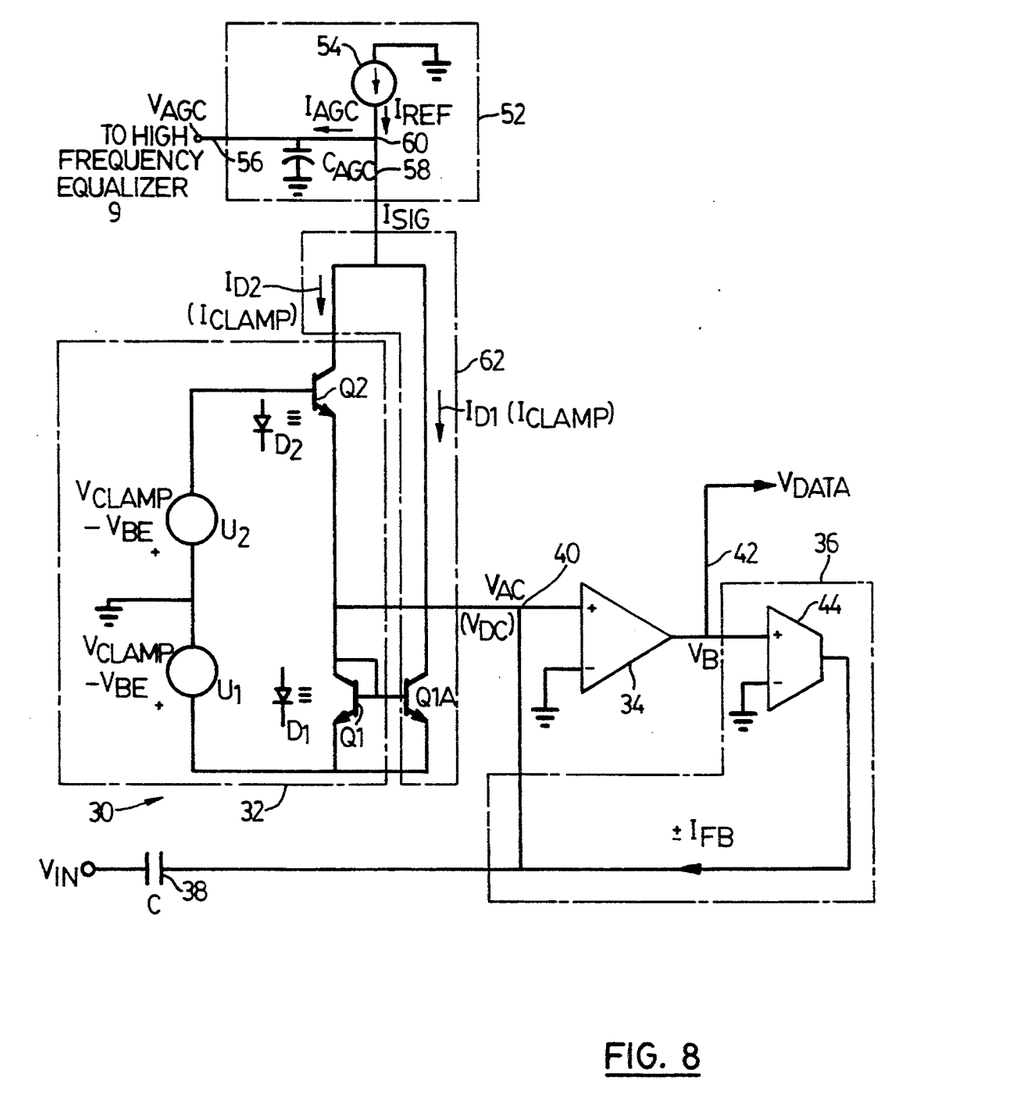
FIG. 8 shows a circuit for the DC restorer of FIG. 7 which is integrated with the automatic gain controller.
Figure 9A:
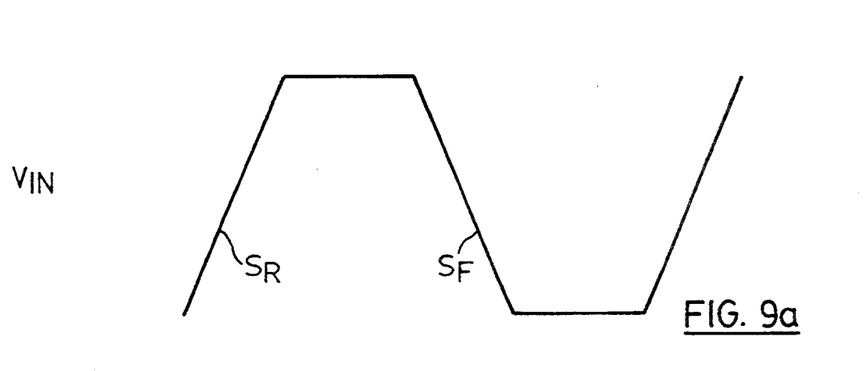
FIGS. 9(a)-(e) show the various voltage and current waveforms associated with the clamping circuit of the hysteric bipolar clamp DC restorer of FIG. 8.
Figure 9B:
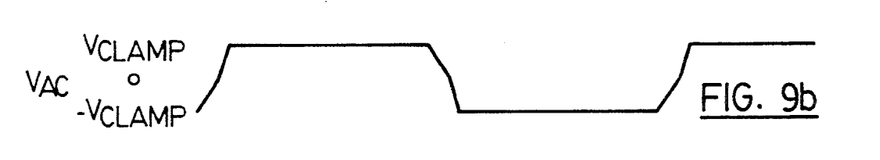
Figure 9C:
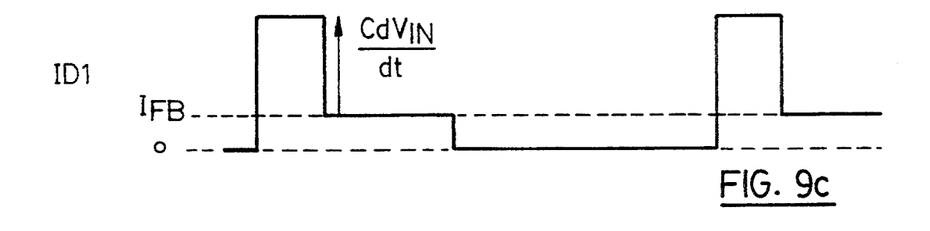
Figure 9D:
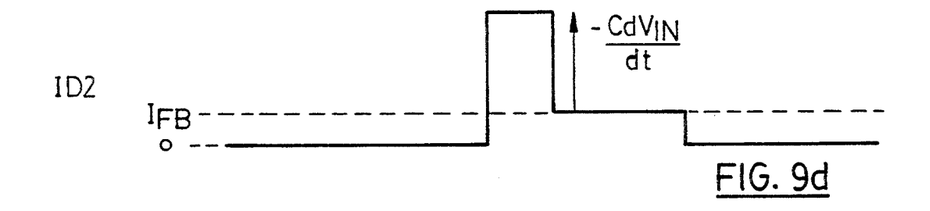
Figure 9E:
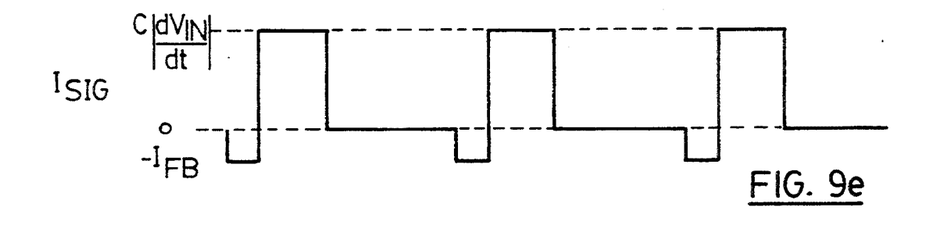

Reference is next made to FIG. 8 which shows in detail the DC restorer 50 and the automatic gain controller 52 according to the second embodiment of the present invention. Corresponding reference numerals indicate elements corresponding to those of FIG. 5. The automatic gain controller 52 (indicated by the broken outline) comprises a current source 54 which produces the reference current $I_{REF}$, an integrating capacitor $C_{AGC}$ and a voltage output line 56. The automatic gain controller 52 is coupled to the DC restorer 50 through a current input line 58 which is connected to the current source 54 at node 60. The magnitude of the reference current $I_{REF}$ should be chosen such that the equalized output of the high frequency equalizer 9 (FIG. 7) stabilizes at a level which represents optimal high frequency equalization as will be-within the understanding of one skilled in the art. For a typical high frequency equalizer 9, the reference current $I_{REF}$ should be in the range 200–300 ma.

The automatic gain controller 52 produces a control current $I_{AGC}$ which flows into the integrating capacitor $C_{AGC}$. The capacitor $C_{AGC}$ integrates the control current $I_{AGC}$ to produce a voltage control signal $V_{AGC}$ which is fed to the high frequency equalizer via line 56. The gain control current $I_{AGC}$ is the difference between the reference current $I_{REF}$ and the signal current $I_{SIG}$ taken at node 60. The signal current $I_{SIG}$ is a current component which flows into the DC restorer 50 via line 58. The signal current $I_{SIG}$ is produced from the difference between the feedback current $I_{FB}$ and a clamping current $I_{CLAMP}$, where the clamping current $I_{CLAMP}$ is a current flowing in the conducting clamping diode $D_1$ or $D_2$. In FIG. 8, the clamping current $I_{CLAMP}$ corresponds to current $I_{D1}$ if diode $D_1$ is conducting and current $I_{D2}$ if diode $D_2$ is conducting. Recall that diode $D_1$ conducts if the coupled binary signal $V_{AC}$ is positive and diode $D_2$ conducts if the coupled binary signal $V_{AC}$ is negative. In other words, the automatic gain controller 52 compares the reference current $I_{REF}$ to the difference between the clamped current $I_{D1}$ or $I_{D2}$ and the feedback current $I_{FB}$ (i.e. $I_{SIG} = I_{D1}$ (or $I_{D2}$) $- I_{FB}$). The difference between the reference current $I_{REF}$ and the signal current $I_{SIG}$ is the current $I_{AGC}$ which is integrated by the capacitor $C_{AGC}$ to produce the voltage control signal $V_{AGC}$. The voltage control signal $V_{AGC}$ is then applied as negative feedback to control the gain of the high frequency equalizer 9. Since the current flowing in the clamping diodes $D_1$ or $D_2$ is proportional to the amplitude of the binary signal $V_{AC}$, the DC restorer 52 provides an elegant implementation for automatic gain control as will become clear from the following explanation.

In the second embodiment of the DC restorer 50 shown in FIG. 8, the clamping diodes $D_1$ and $D_2$ (of FIG. 5) have been replaced by respective transistors $Q_1$ and $Q_2$. The transistors $Q_1$ and $Q_2$ permit the clamping circuit 32 to be integrated with a current sensor 62 as shown in FIG. 8. The current sensor 62 senses the current flowing in the diode-connected transistor $Q_1$ when it is conducting, i.e. the AC coupled binary signal $V_{AC}$ is positive. When the AC coupled binary signal $V_{AC}$ is negative the diode current $I_{D2}$ is a direct component of the signal current $I_{SIG}$.

The current sensor 62 comprises the combination of diode-connected transistor $Q_1$ (i.e. diode $D_1$) and a transistor $Q_{1A}$. The base of transistor $Q_{1A}$ is connected to the base of diode-connected transistor $Q_1$ to form a current mirror as will be recognized by one skilled in the art. The current sensor 62 is coupled to the current output line 58 from the automatic gain controller 52. The clamping current $I_{CLAMP}$ is represented as either current $I_{D1}$ or current $I_{D2}$, depending on which transistor $Q_1$ or $Q_2$ is conducting. The current $I_{D2}$ flows as collector current through transistor $Q_2$ when it is forward-biased or conducting. The other diode current $I_{D1}$ flows through diode-connected transistor $Q_1$ when it is forward-biased by the AC coupled binary signal $V_{AC}$ present at the summing node 40. The sensing transistor $Q_{1A}$ has a collector current which is denoted by $I_{C1A}$. By the operation of the current mirror comprising diode-connected transistor $Q_1$ and sensing $Q_{1A}$, the collector current $I_{C1A}$ of the sensing transistor $Q_{1A}$ will be equal to the diode current $I_{D1}$ (i.e. the clamping current $I_{CLAMP}$) which flows in the diode-connected transistor $Q_1$ when it is forward-biased. When diode-connected transistor $Q_1$ is reverse biased or not conducting, the clamping current $I_{CLAMP}$ comprises current $I_{D2}$ which flows into the collector of transistor $Q_2$ which is forward-biased or conducting because the AC coupled binary signal $V_{AC}$ at the summing node 40 is negative.

Referring still to FIG. 8, the clamping current $I_{CLAMP}$ (i.e. current $I_{D1}$ or current $I_{D2}$) flows into the summing node 40. The clamping current $I_{CLAMP}$ which is in excess of the feedback current $I_{FB}$ is due to the clamping of the input binary signal $V_{IN}$ by the clamping circuit 32. Furthermore, the clamping current $I_{CLAMP}$ (i.e. current $I_{D1}$ or current $I_{D2}$) is a measure of the amplitude and rise time of the input binary signal $V_{IN}$. Therefore, the signal current $I_{SIG}$ is the current which results from a voltage change on the coupling capacitor 38. The magnitude or pulse height of the signal current $I_{SIG}$ is proportional to the rate of rise of the input binary signal $V_{IN}$. The duration (i.e. pulse width) of the signal current $I_{SIG}$, on the other hand, is proportional to the amount by which the input binary signal $V_{IN}$ exceeds the clamping level (i.e. voltage reference $U_1$ or $U_2$), and inversely proportional to the rate of rise of the input signal $V_{IN}$. Accordingly, the average of the signal current $I_{SIG}$, (i.e. pulse height × pulse width), provides an approximate measure of the amplitude of the input binary signal $V_{IN}$ which is independent of the rise time. These relationships are clearly shown in FIG. 9.

FIG. 9 shows the waveforms for the currents $I_{D1}$ and $I_{D2}$ which flow in the collectors of transistors $Q_1$ and $Q_2$ as a result of the input binary signal $V_{IN}$ being clamped at the summing node 40. The feedback current $I_{FB}$ is the positive feedback current which flows into the clamping circuit 32 (FIGS. 5 and 8). For the input binary signal $V_{IN}$ shown in FIG. 9(a), consider the rising edge $S_R$. The positive rising edge $S_R$ of the input signal $V_{IN}$ coupled at node 40 causes diode-connected transistor $Q_1$ to conduct, i.e. current $I_{D1}$ will flow in diode $D_1$ along with the feedback current $I_{FB}$. The net current flowing in diode-connected transistor $Q_1$ (i.e. $I_{D1} - I_{FB}$) is proportional to the amplitude and rise time of input binary signal $V_{IN}$. The current $I_{D1}$ can be calculated from the product of the coupling capacitor 39 capacitance C times the rate of change for the input signal, i.e. $I_{D1} = C \times V_{IN}/dt$. The signal amplitude current $I_{SIG}$ which flows when diode-connected transistor $Q_1$ is forward-biased is equal to the current $I_{D1}$ (i.e. $I_{CLAMP}$) minus the feedback current $I_{FB}$. Since the signal amplitude current $I_{SIG}$ results from the voltage change (i.e. d $V_{IN}/dt$) across the coupling capacitor 38, the amplitude of the signal amplitude current $I_{SIG}$ is proportional to the rise time of the input binary signal $V_{IN}$ (i.e. rate of change). On the other hand, the width of the pulse for the signal amplitude current $I_{SIG}$ shown in FIG. 9(c) is proportional to the amount by which the input binary signal $V_{IN}$ exceeds the voltage reference $U_1$, and inversely proportional to the rate of rise $S_R$ of the input signal $V_{IN}$. The second property follows because the faster the rise of a signal, the larger the magnitude which means the narrower the pulse. Therefore, the average of the signal amplitude current $I_{SIG}$, i.e. pulse height × pulse width, provides an approximate measure of the amplitude of the input binary signal $V_{IN}$. A similar analysis follows for the falling edge (denoted by reference $S_F$ in FIG. 9(a)) for the input binary signal $V_{IN}$. As will be appreciated by one skilled in the art, the second embodiment of the present invention provides a DC restorer 50 which can be merged with the automatic gain controller 52 to elegantly couple with the high frequency equalizer 9. The negative feedback (i.e. $V_{AGC}$) control of the high frequency equalizer 9, in turn, relaxes the requirement for precision matching and performance in the equalizer 9.

Although various preferred embodiments of the present invention have been described in detail, it will be appreciated by those skilled in the art, that variations may be made to the present invention without departing from the spirit of the invention or the scope of the appended claims.

I claim:

1. A device for restoring a binary signal having a DC value and having one or more pulses each with a rising edge and a falling edge, the binary signal being coupled to said device by a capacitor having first and second terminals, said device comprising:
    (a) an input port coupled to the first terminal of the capacitor for receiving the binary signal and producing a coupled binary signal;
    (b) clamping means for clamping the coupled binary signal when said coupled binary signal exceeds a predetermined range, said clamping means having an input for receiving said coupled binary signal and being connected to the second terminal of the capacitor;
    (c) means for generating a signal component for controlling the rising and falling edges of the pulses in the coupled binary signal, said means for generating having an output for said signal component and said output being coupled to the second terminal of the capacitor;
    (d) means for combining said signal component the coupled binary signal to produce a restored binary signal and said restored binary signal having pulses with rising and falling edges dependent on said signal component, said means for combining being connected to the output of said means for generating and to the second terminal of the capacitor; and
    (e) means for outputting the restored binary signal, said means for outputting having an input connected to said means for combining and an output connected to the input of said means for generating.

2. The device as claimed in claim 1, wherein said clamping means comprises first and second diodes, each of said diodes having cathode and anode terminals, the anode of said first diode being connected to the cathode of said second diode and forming the input for said clamping means and the cathode of said first diode and the anode of second diode being connected.

3. The device as claimed in claim 2, wherein said clamping means further includes first and second signal reference means, said first signal reference means being coupled to the cathode of said first diode and said second signal reference means being coupled to the anode of said second diode, said first diode and said first signal reference means providing an upper limit in said predetermined range for clamping the binary signal and said second diode and second signal reference means providing a lower limit in said predetermined range for clamping the binary signal.

4. The device as claimed in claim 3, wherein said means for generating a signal component comprises a feedback network connected to the output of said means for outputting and to the second terminal of the capacitor, and said signal component providing a current which is fed to the capacitor for controlling the rising and falling edges of the pulses in said coupled binary signal.

5. The device as claimed in claim 4, wherein said means for outputting includes digital converting means for converting said restored binary signal to a digital level output signal.

6. The device as claimed in claim 2 or 3, further including gain control means for producing a gain control signal, said gain control means having an input coupled to said clamping means, and said clamping means including means for producing an amplitude signal responsive to the amplitude of said coupled binary signal, and said gain control means including means for generating said gain control signal from said amplitude signal received on said input.

7. The device as claimed in claim 6, wherein said means for producing an amplitude signal comprises a current sensor coupled to said first and second diodes, said current sensor also being coupled to the input of said gain control means, and said current sensor producing said amplitude signal in response to a current which flows in one of said diodes when said respective diode is turned on by said coupled binary signal.

8. The device as claimed in claim 7, wherein said gain control means includes a gain control output for outputting said gain control signal, said gain control output being coupled to a high frequency equalizer having means responsive to said gain control signal for controlling operation of the high frequency equalizer.

9. A device for restoring a binary signal having a DC value and having one or more pulses each with a rising edge and a failing edge, said device being suitable for use with a high frequency equalizer circuit in a cable equalizer system, said device comprising:

(a) an input port for receiving the binary signal, said input port being formed from a first terminal of a capacitor for producing a coupled binary signal;

(b) clamping means for clamping the coupled binary signal when said coupled binary signal exceeds a predetermined range, said clamping means having an input for receiving said coupled binary signal and said input being connected to a second terminal of said capacitor;

(c) means for generating a signal component for controlling the rising and falling edges of the pulses in the coupled binary signal, said generating means having an output for said signal component and said output being coupled to the second terminal of said capacitor;

(d) means for combining said signal component with the coupled binary signal to produce a restored binary signal and said restored binary signal having pulses with rising and falling edges dependent on said signal component, said means for combining being connected to the second terminal of said capacitor and to the output of said generating means;

(e) output means for outputting said restored binary signal, said output means having an input connected to said means for combining and an output connected to the input of said means for generating; and (f) gain control means for producing a gain control signal, said gain control means having an input coupled to said clamping means, and said clamping means including means for producing an amplitude signal responsive to the amplitude of said coupled binary signal, and said gain control means including means for generating said gain control signal from said amplitude signal received at said input.

10. The device as claimed in claim 9, wherein said means for producing an amplitude signal comprises a current sensor, said current sensor being coupled to the input of said gain control means and producing said amplitude signal in response to a current which flows in said clamping means in response to said coupled binary signal being clamped.

11. The device as claimed in claim 10, wherein said gain control means includes a gain control output for outputting said gain control signal, said gain control output being coupled to the high frequency equalizer and the high frequency equalizer having means responsive to said gain control signal for controlling operation of the high frequency equalizer.

12. A method for restoring a binary signal having a DC value and having one or more pulses each with a rising edge and a falling edge, the binary signal being coupled through a capacitor, said method comprising the steps of:

(a) inputting the binary signal through the capacitor to produce a coupled binary signal;

(b) clamping said coupled binary signal when said coupled binary signal exceeds a predetermined range;

(c) generating a signal component responsive to said coupled binary signal for controlling the rising and falling edges of the pulses in said coupled binary signal; and (d) combining said signal component with said coupled binary signal to produce a restored binary signal.

13. The method claimed in claim 12, further including the step of converting said restored binary signal to an output signal having digital logic levels.

14. The method claimed in claim 12 or 13, further including the step of generating an amplitude signal wherein said amplitude signal is responsive to the amplitude of said coupled binary signal which is clamped according to step (b).

* * * * *